(12) United States Patent
Sauerbrey et al.

(10) Patent No.: US 10,944,420 B2
(45) Date of Patent: Mar. 9, 2021

(54) POWER SAVING TECHNIQUE FOR VOLTAGE-CONTROLLED RING OSCILLATOR AND VOLTAGE-CONTROLLED RING OSCILLATOR-BASED SIGMA DELTA MODULATOR

(71) Applicant: Intel Corporation, Santa Clara, CA (US)

(72) Inventors: Jens Sauerbrey, Taufkirchen (DE); Jacinto San Pablo Garcia, Neubiberg (DE); Enara Ortega, Unterhaching (DE); Massimo Rigo, Munich (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/787,099

(22) Filed: Feb. 11, 2020

(65) Prior Publication Data
US 2020/0266827 A1    Aug. 20, 2020

(30) Foreign Application Priority Data
Feb. 14, 2019   (DE) .......................... 102019103710.7

(51) Int. Cl.
*H03M 3/00* (2006.01)
*H03K 3/03* (2006.01)
*H03K 3/037* (2006.01)
*H03K 5/24* (2006.01)

(52) U.S. Cl.
CPC ............ *H03M 3/458* (2013.01); *H03K 3/037* (2013.01); *H03K 3/0315* (2013.01); *H03K 5/24* (2013.01); *H03M 3/464* (2013.01)

(58) Field of Classification Search
CPC ........ H03M 3/458; H03M 3/464; H03K 5/24; H03K 3/0315; H03K 3/037
USPC ................................................. 341/143, 144
See application file for complete search history.

(56) References Cited

U.S. PATENT DOCUMENTS

| | | | | |
|---|---|---|---|---|
| 9,350,328 | B1 * | 5/2016 | Trauth | H03K 3/014 |
| 10,587,253 | B1 * | 3/2020 | Huang | G06F 1/305 |
| 10,693,445 | B1 * | 6/2020 | Liu | H01F 10/3254 |
| 10,707,844 | B2 * | 7/2020 | Wang | H03K 3/0315 |

* cited by examiner

*Primary Examiner* — Brian K Young
(74) *Attorney, Agent, or Firm* — 2SPL Patent Attorneys PartG mbB; Yong Beom Hwang

(57) ABSTRACT

A voltage-controlled ring oscillator (VCRO) and a VCRO-based sigma delta modulator having capability of enabling and disabling the VCRO cells. A VCRO includes a plurality of inverters coupled in a ring and a transition detector. The transition detector detects a transition of a first inverter and sends a control signal to enable a second inverter if the transition of the first inverter is detected. The transition detector may include a comparator configured to compare an input and an output of an inverter(s) to detect the transition of the first inverter and a latch configured to hold the control signal until it is reset.

14 Claims, 13 Drawing Sheets

POWER SAVING TECHNIQUE FOR VOLTAGE-CONTROLLED RING OSCILLATOR AND VOLTAGE-CONTROLLED RING OSCILLATOR-BASED SIGMA DELTA MODULATOR

CROSS REFERENCE TO RELATED APPLICATIONS

This application claims priority under 35 U.S.C. § 119 to German patent application No. 10 2019 103 710.7, filed Feb. 14, 2019, which is incorporated by reference as if fully set forth herein.

FIELD

Examples relate to a voltage-controlled ring oscillator (VCRO) and a VCRO-based sigma delta modulator, more particularly a VCRO-based sigma delta modulator with capability of enabling and disabling the VCRO cells and methods of using the same.

BACKGROUND

Sigma delta modulators are widely used for analog-to-digital (A/D) conversion and digital-to-analog (D/A) conversion, or the like. Generally, in sigma delta modulators an input signal is introduced into a loop filter, and quantized by a quantizer, and then processed through digital filters. In order to compensate for the errors a feedback signal is sent back via a digital-to-analog converter (DAC) to be subtracted from the input signal before entering the quantizer.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Examples are disclosed for a VCO-based sigma delta modulator with capability of enabling and disabling VCO cells.

Figure 1:
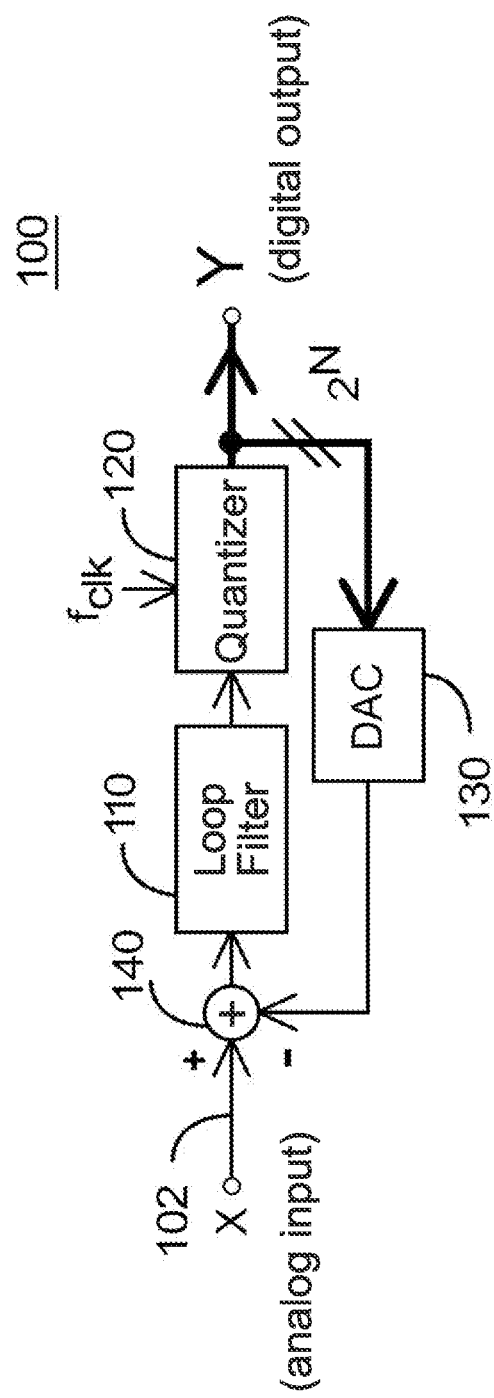
FIG. 1 is a block diagram of a sigma-delta modulator-based analog-to-digital converter (ADC) in accordance with one example.

FIG. 1 is a block diagram of a sigma-delta modulator-based ADC 100 in accordance with one example. The ADC 100 includes a loop filter 110, a quantizer 120, and a digital-to-analog converter (DAC) 130. The input analog signal 102 is filtered through the loop filter 110. The loop filter 110 provides a gain for the sigma delta modulator, which attenuates the quantization errors in the band of interest. For example, the loop filter 110 may be an integrator (e.g. a first order or any higher order integrator). The quantization noise may be high-pass filtered and may be attenuated or shaped in the band of interest due to the gain provided by the loop filter 110.

The quantizer 120 converts the loop filter output to a digital signal. The quantizer 120 may be an n-bit quantizer, where n is an integer. The quantizer 120 may have a relatively low resolution (e.g. n being 1 to 6 bits). In order to compensate for the errors a feedback signal is sent back via the DAC 130 to be subtracted from the input signal by an adder 140 before entering the loop filter 110. The DAC 130 may be an n-bit DAC.

A VCO-based quantizer may be used in the multi-bit sigma-delta modulators. A VCO is an electronic oscillator whose oscillation frequency is controlled by an input voltage. The input voltage determines the instantaneous oscillation frequency of the VCO. Assuming a linear VCO, the output of the VCO is a frequency-domain signal approximating the input signal. The VCO-based quantizer allows one additional order of noise shaping, which increases the resolution of the modulator. Another attractive aspect of the VCO-based quantizer is that it is mainly implemented in digital. Usually, this structure has only dynamic current consumption.

However, there is a drawback of using a VCO-based quantizer in a sigma-delta modulator. The drawback is that the relationship between the input voltage and the output frequency of the VCO-based quantizer is not linear, which generates harmonic distortion at the output. Although, even-order distortion can be cancelled using a differential topology, the odd-order distortions remain and limit the quantizer linearity degrading the signal-to-noise and distortion ratio (SNDR) performance of the sigma-delta modulator.

Figure 2:
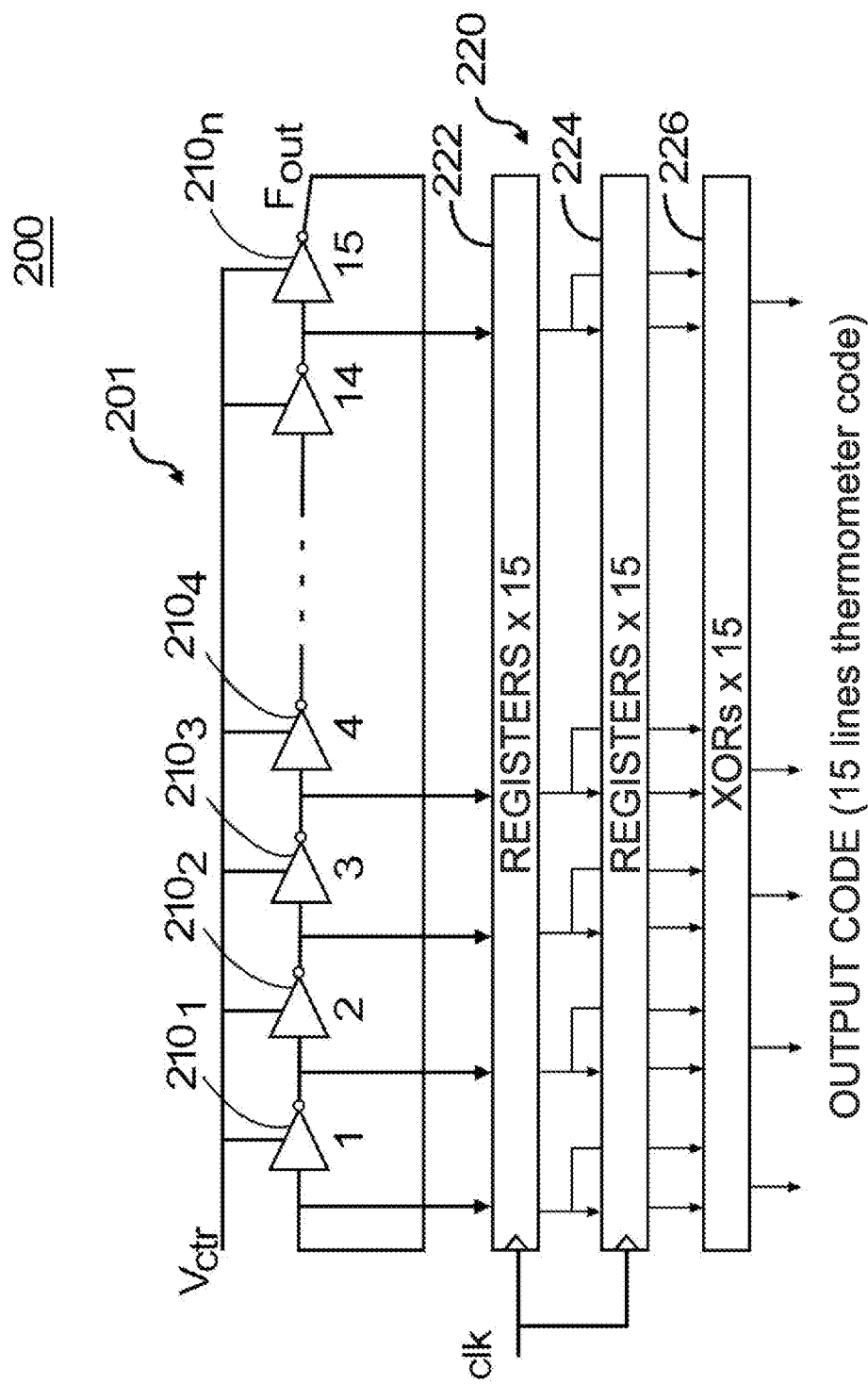
FIG. 2 shows an example VCO-based quantizer using a ring oscillator.

The VCO-based quantizer may be implemented with a ring oscillator. FIG. 2 shows an example VCO-based quantizer 200 using a ring oscillator (i.e. a voltage-controlled ring oscillator (VCRO)). Hereinafter, the terms "ring oscillator" and "VCRO" will be used interchangeably. A ring oscillator 201 is a device composed of a number of inverters $210_1$-$210_n$ in a ring, whose output oscillates between two voltage levels. The inverters $210_1$-$210_n$ are cascaded in a chain. An output of each inverter is used as an input for the next one. The output of the last inverter $210_n$ is fed back to the first inverter $210_1$ in the chain. Because of the delay time of each stage of the ring oscillator 201 the whole circuit oscillates at a certain frequency. The oscillation frequency may depend on the number of stages and the delay time of the inverters $210_1$-$210_n$. The oscillation frequency also changes depending on the input voltage ($V_{ctr}$). The ring oscillator 201 outputs multi-phase signals, i.e. n bits. The ring oscillator 201 converts the input voltage into phase information and the phase information is fed into a frequency detector 220. In one example, the frequency detector 220 may include two sets of registers 222, 224 and one set of exclusive OR gates 226. The outputs of the inverters $210_1$-$210_n$ are sampled successively into two sets of registers 222, 224 by sampling clocks and two consecutive outputs of each inverter $210_1$-$210_n$ sampled into the registers 222, 224 are compared with the XOR gate 226.

Figure 3:
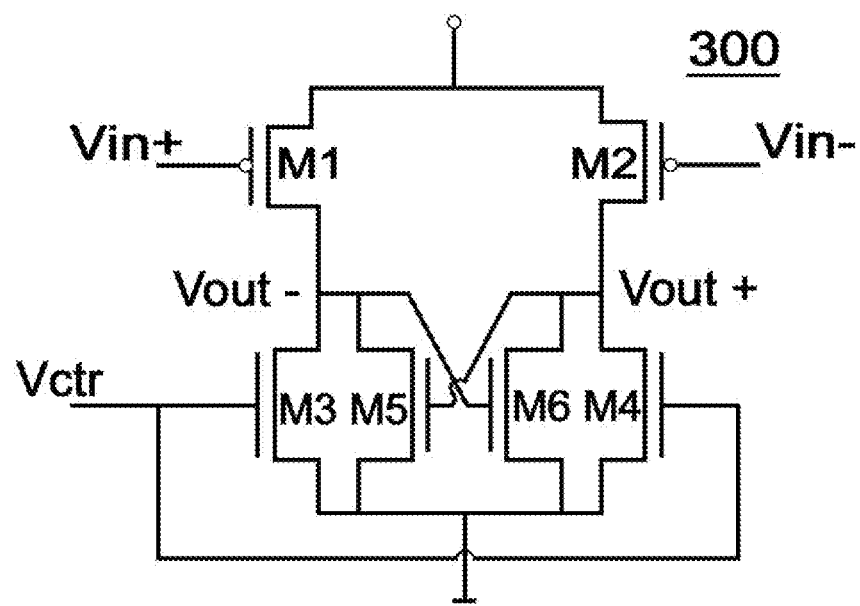
FIG. 3 shows an example ring oscillator cell.

An inverter in cross-coupled differential topology (or its variants) may be used as a cell of the ring oscillator 201. FIG. 3 shows an example ring oscillator cell 300 (i.e. inverter). The structure of the inverter in FIG. 3 may present a good linearity over a wide range of input voltages. It should be noted that the structure of the inverter shown in FIG. 3 is provided merely as an example, not as a limitation, and a different inverter structure may be used. It should also be noted that the inverter used in a ring oscillator may be a differential inverter (with differential inputs and differential outputs), a single-ended inverter (with a single input and a single output), or a differential inverter in single-ended configuration, and the examples disclosed herein are applicable to any type or configuration of the inverters.

Referring to FIG. 3, the ring oscillator cell 300 may include a plurality of transistors (e.g. complementary metal-oxide-semiconductor field effect transistors (c-MOSFETs), or the like). The cell 300 may include a differential pair of transistors (M1 and M2) and a load pair of transistors (M3 and M4, and M5 and M6). The load pair of transistors M3 and M4 act as a resistor. The input voltage, $V_{ctr}$, (i.e. the output from the loop filter 110 in FIG. 1), is coupled to the gate of the load transistors M3 and M4, and the resistance of the transistors M3 and M4 varies depending on the input voltage, which in turn controls the oscillation frequency of the ring oscillator 201.

The main drawback of this topology is the static current flowing through the load transistors. In order to maintain the linearity of the VCRO (i.e. a ring oscillator), the delay of each cell (i.e. each inverter $210_1$-$210_n$) should be linearly proportional to its input voltage. For this reason, a delay cell structure with bias currents may be used, which results in static current consumption. In order to reduce the current consumption, non-linear delay cells may be used along with linearity calibration. However, this solution increases complexity in the system.

The examples disclosed herein may avoid the static current consumption without increasing the complexity of the system. In examples disclosed herein, the cells (i.e. delay cells) of the VCRO are turned on when the cells are switching and kept disabled for the rest of the time, therefore, avoiding the static current consumption. In accordance with the examples, the current consumption of the VCRO is considerably reduced while keeping the same linearity.

Figure 4:
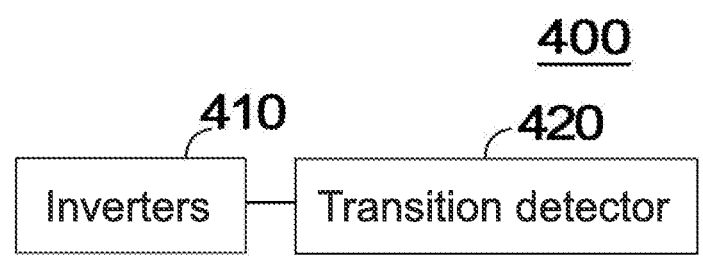
FIG. 4 is a block diagram of a VCRO in accordance with one example.

FIG. 4 is a block diagram of a VCRO 400 in accordance with one example. The VCRO 400 may be used as the quantizer 120 in the sigma delta-based ADC in FIG. 1. The VCRO 400 includes a plurality of inverters 410 coupled in a ring and a transition detector 420. The inverters 410 are cascaded in a ring such that an output of one inverter is coupled to an input of a following inverter in the ring. Each inverter inverts an input to an output (i.e. each inverter outputs '1' if an input is '0', and outputs '0' if an input is '1'). The inverters 410 may be single-ended inverters with a single input and a single output. Alternatively, the inverters may be differential inverters with differential inputs and differential outputs (i.e. two inputs of opposite polarity and two outputs of opposite polarity). Alternatively, the inverters may be differential inverters with single-ended configuration.

The number of inverters 410 in the ring may be odd. Alternatively, the number of inverters 410 in the ring may be even (e.g. even number of differential inverters are coupled in a chain with the last inverter cross-coupled to the first inverter in the ring). Normally, an input and output of an inverter are opposite in the ring, but an input and output of one inverter in the ring becomes the same and a state of that inverter (a state of input and output of the inverter) transitions.

The transition detector 420 is configured to detect the transition of a state of one inverter and send a control signal (e.g. an enable signal) to enable another inverter in the ring if the state transition of the inverter is detected. The two inverters may or may not be adjacent inverters in the ring. In accordance with examples disclosed herein, each of the inverters in the ring remains in a disabled state and enabled if it is detected that a certain inverter in the ring is transitioning its state. The control signal also disables another inverter that has been enabled previously. In this way, the static current consumption may be minimized.

In order to detect the transition, the transition detector 420 may include a comparator to compare an input and output of one inverter or alternatively an input and an output of two different inverters. For example, in order to detect the state transition of the first inverter, the input and output of the first inverter may be compared by the comparator, and if the input and output of the first inverter becomes the same, the transition detector 420 detects that the first inverter is in transition, and may send a control signal to the second inverter to enable the second inverter and send the control signal to the third inverter (e.g. the preceding inverter) to disable the third inverter. The first, second, third inverters may or may not be contiguous.

Alternatively, in order to detect the state transition of the first inverter, an input of the first inverter and an output of a second inverter (i.e. another inverter in the ring not contiguous to the first inverter) may be compared. If the input of the first inverter and the output of the second inverter become the same, the transition detector 420 may detect that the first inverter is in transition, and may send a control signal to a third inverter (i.e. still another inverter in the ring, not necessarily the one contiguous to the first inverter) to enable the third inverter and send the control signal to a fourth inverter (e.g. the one preceding the first inverter) to disable a previously enabled inverter.

Since the state transition takes a brief period of time, the transition detector 420 may include a latch to hold the control signal until it is reset by another transition detector.

Figure 5:
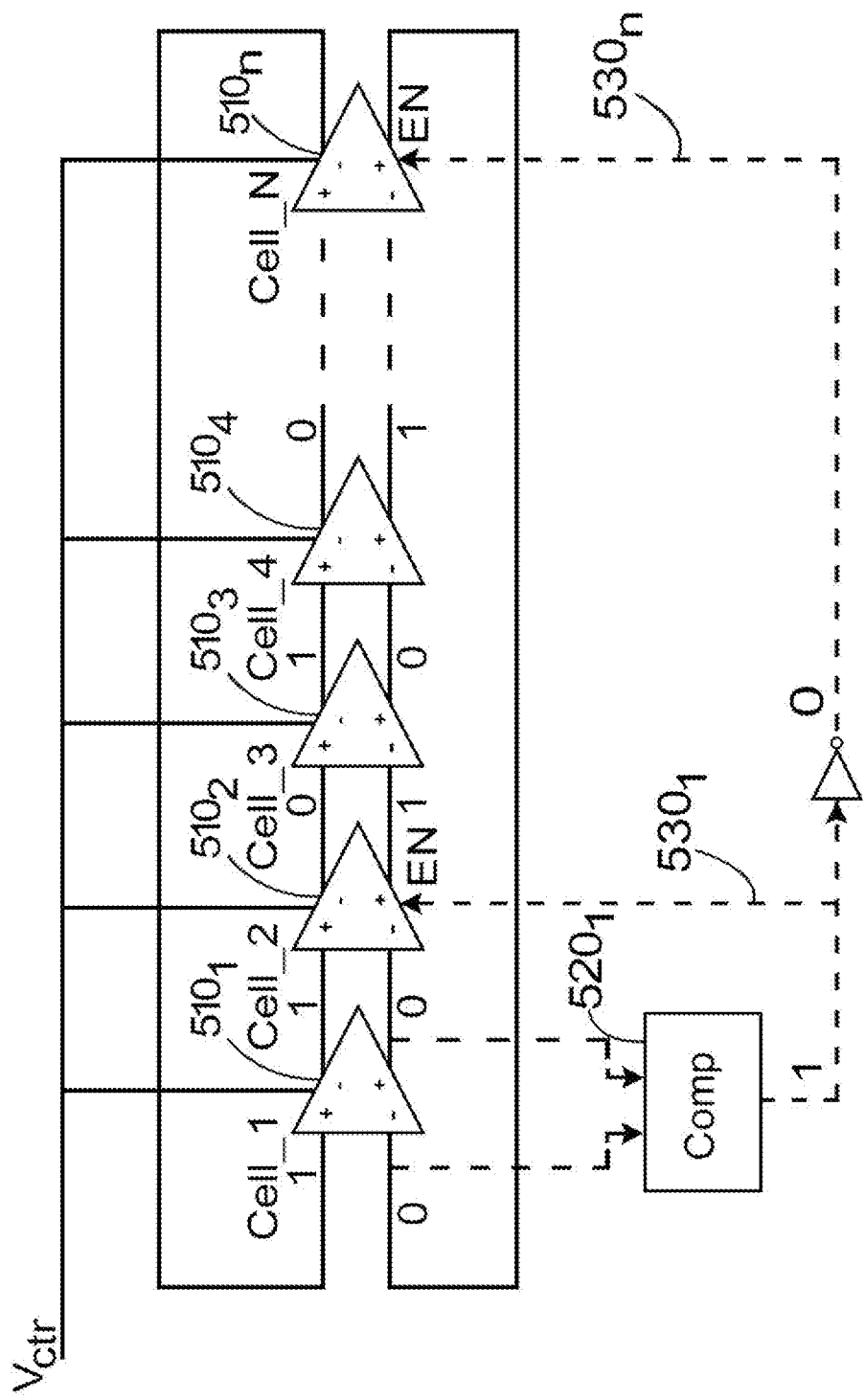
FIG. 5 shows a basic structure of a VCRO and enabling and disabling of cells of the VCRO in accordance with one example.
Figure 8:
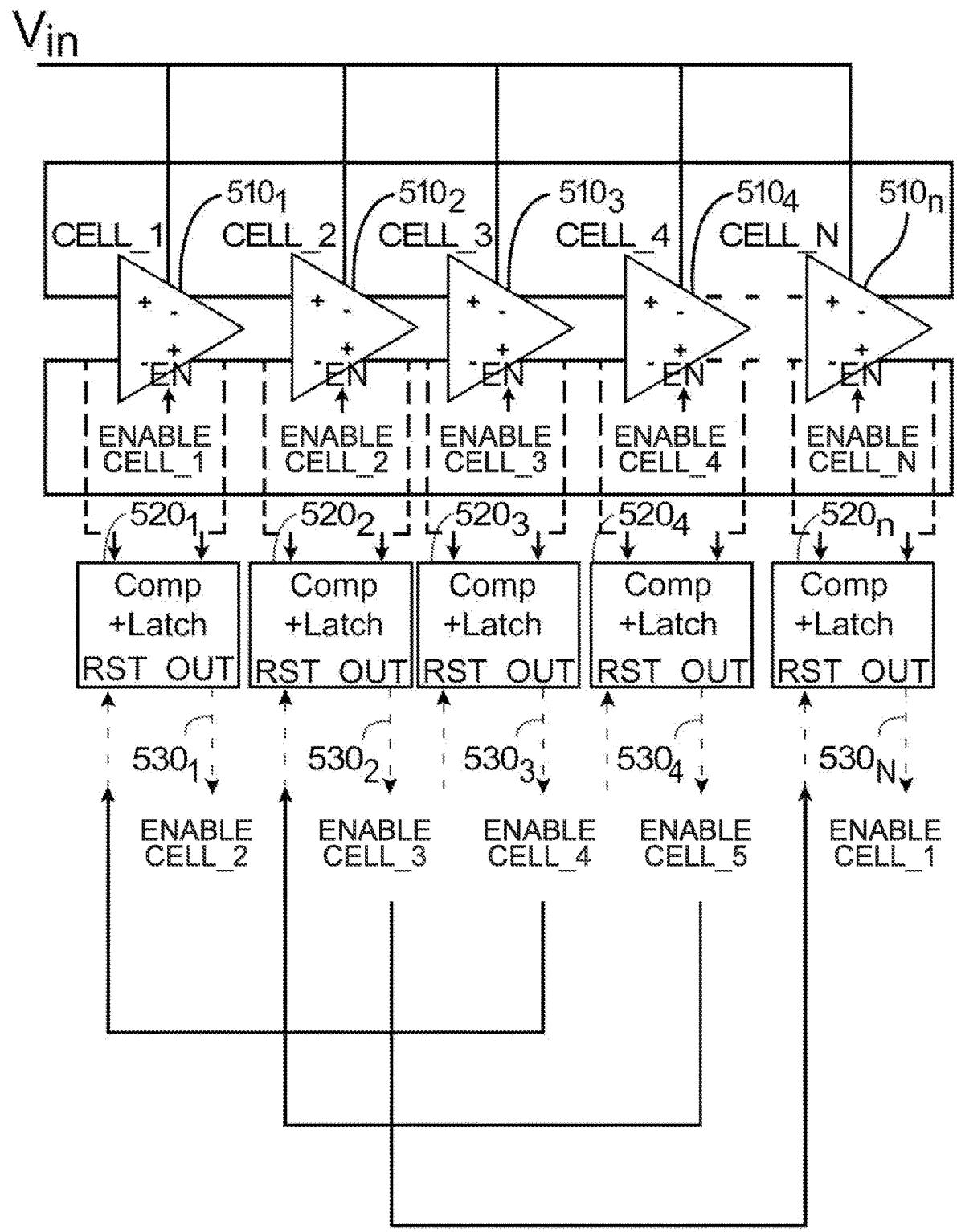
FIG. 8 shows an example structure of a VCRO and implementation of enabling and disabling the cells of the VCRO in accordance with one example.

FIG. 5 shows a basic structure of a VCRO and enabling and disabling of cells of the VCRO in accordance with one example. A VCRO includes N cells $510_1$-$510_n$ (Cell_1, Cell_2, ..., Cell_N), i.e. inverters. Each cell $510_1$-$510_n$ is coupled to a transition detector (e.g. a comparator). FIG. 5 shows only one transition detector $520_1$ to detect the state transition of Cell_1 for simplicity, but each cell is coupled to a transition detector (as shown in FIG. 8).

Normally, an input and output of each cell $510_1$-$510_n$ are opposite (if input is '0' output is '1', and vice versa). Since the odd number of cells are coupled in a chain, (or alternatively even number of differential cells are coupled in a chain with the last cell cross-coupled to the first cell), an input and output of one cell in the ring are transitioning at some point in the VCRO. In the example shown in FIG. 5, the first cell (Cell_1) is in transition.

The transition detector (e.g. a comparator) in the VCRO may compare an input and output of a cell and detects a transition of a state of the cell when the input and output of the cell become the same. In the example shown in FIG. 5, the input and output of the cell $510_1$ are compared by the transition detector $520_1$ and a state transition of the cell $510_1$ is detected if the input and output of the cell $510_1$ become the same.

When a state transition of the cell $510_1$ is detected by the transition detector $520_1$, the transition detector $520_1$ may send a control signal $530_1$ (enable/disable signal) to enable the succeeding cell (the cell $510_2$ in this example) in the ring and send a control signal $530_n$ to disable the preceding cell (the cell $510_n$ in this example) in the ring which has been switched on. The control signal $530_n$ sent to the preceding cell $510_n$ may be an inverted version of the control signal $530_1$ sent to the succeeding cell $510_2$.

Figure 6:
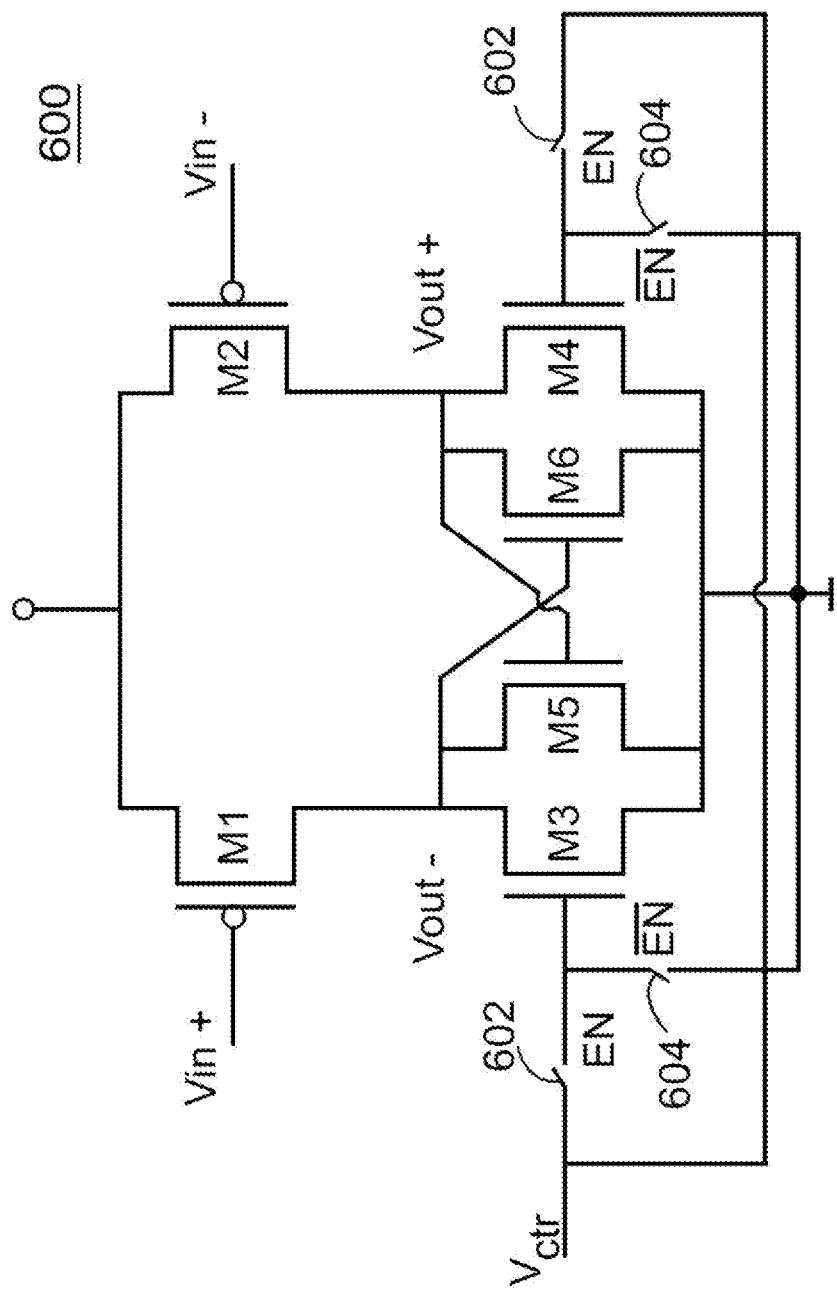
FIG. 6 shows an example ring oscillator cell including switches for enabling and disabling in accordance with one example.

FIG. 6 shows an example ring oscillator cell 600 (i.e. inverter) including switches for enabling and disabling in accordance with one example. The structure of the inverter shown in FIG. 6 is similar to the one shown in FIG. 3 and only the difference will be explained for simplicity. It should be noted that the structure of the cell 600 shown in FIG. 6 is provided merely as an example, not as a limitation, and a different inverter structure may be used. The cell 600 includes switches 602, 604 for turning on and off the cell 600, respectively. The first switch 602 is coupled to the input signal on one end and to the gate of the transistors M3 or M4 on the other end and is switched on and off by the control signal (i.e. the enable signal) from the transition detector. The second switch 604 is coupled to the gate of the transistors M3 or M4 on one end and to the ground on the other end, and is switched on and off by the compliment of the control signal from the transition detector. When the control signal is high, the first switch 602 is on and the second switch 604 is off, which enables the input signal to drive the cell 600. When the control signal is low, the first switch 602 is off and the second switch 604 is on, which disconnects the input signal to the cell.

Figure 7:
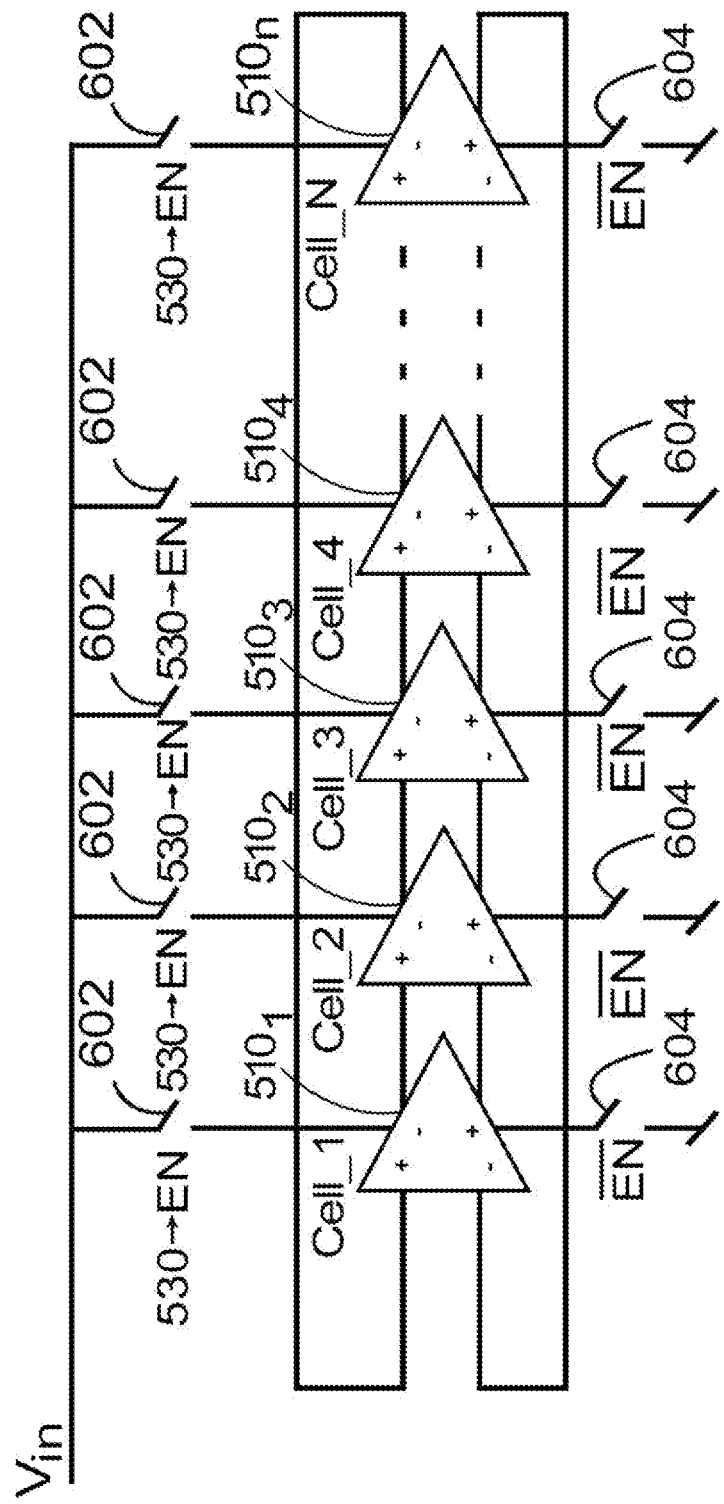
FIG. 7 shows a schematic structure of a VCRO including switches for selectively connecting and disconnecting the VCRO cells from the input signal.

FIG. 7 shows a schematic structure of a VCRO including switches for selectively connecting and disconnecting the VCRO cells from the input signal. Each cell $510_1$-$510_n$ is coupled to the input signal via a switch(es) 602, 604 that is controlled by the control signal 530 from the corresponding transition detector (not shown in FIG. 7).

FIG. 8 shows an example structure of a VCRO and implementation of enabling and disabling the cells of the VCRO in accordance with one example. The VCRO includes N cells $510_1$-$510_n$ (Cell_1, Cell_2, Cell_N), i.e. inverters and N transition detectors $520_1$-$520_n$. Each cell $510_1$-$510_n$ is coupled to a corresponding transition detector $520_1$-$520_n$ for detecting a state transition of each cell $510_1$-$510_n$. Each transition detector $520_1$-$520_n$ may include a comparator. Since the transition to be detected happens for a short period of time, the transition detector $520_1$-$520_n$ may also include a latch. When a transition of a cell $510_1$-$510_n$ is detected, a transition detector $520_1$-$520_n$ coupled to the cell $510_1$-$510_n$ asserts a control signal $530_1$-$530_n$ to enable another cell (e.g. a succeeding cell in the ring), and this control signal is maintained by the latch until it is reset by another transition detector $520_1$-$520_n$.

For example, the transition detector $520_1$ detects a state transition of the cell $510_1$ and asserts a control signal $530_1$. The control signal $530_1$ is latched by a latch in the transition detector $520_1$ and sent to the cell $510_2$ to enable the cell $510_2$. The control signal $530_1$ is also sent to the cell $510_{n-1}$ to reset the latch in the transition detector $520_{n-1}$. As the latch in the transition detector $520_{n-1}$ is reset, the control signal going to the cell $510_1$ is released and the cell $510_1$ is disabled. After the cell $510_2$ is enabled, the transition detector $520_2$ detects a state transition of the cell $510_2$ and asserts a control signal $530_2$. The control signal $530_2$ is latched by a latch in the transition detector $520_2$ and sent to the cell $510_3$ to enable the cell $510_3$ and to the cell $510_n$ to reset the latch in the transition detector $520_n$. As the latch in the transition detector $520_n$ is reset, the control signal going to the cell $510_2$ is released and the cell $510_2$ is disabled.

If the VCRO speed is very high but the speed of the comparator and latch circuitry is not fast enough, the following cell may not be enabled on time. In order to solve this problem, in one example, the control signal may be generated not from the next cell but from one or few cells ahead of the next cell.

Figure 9:
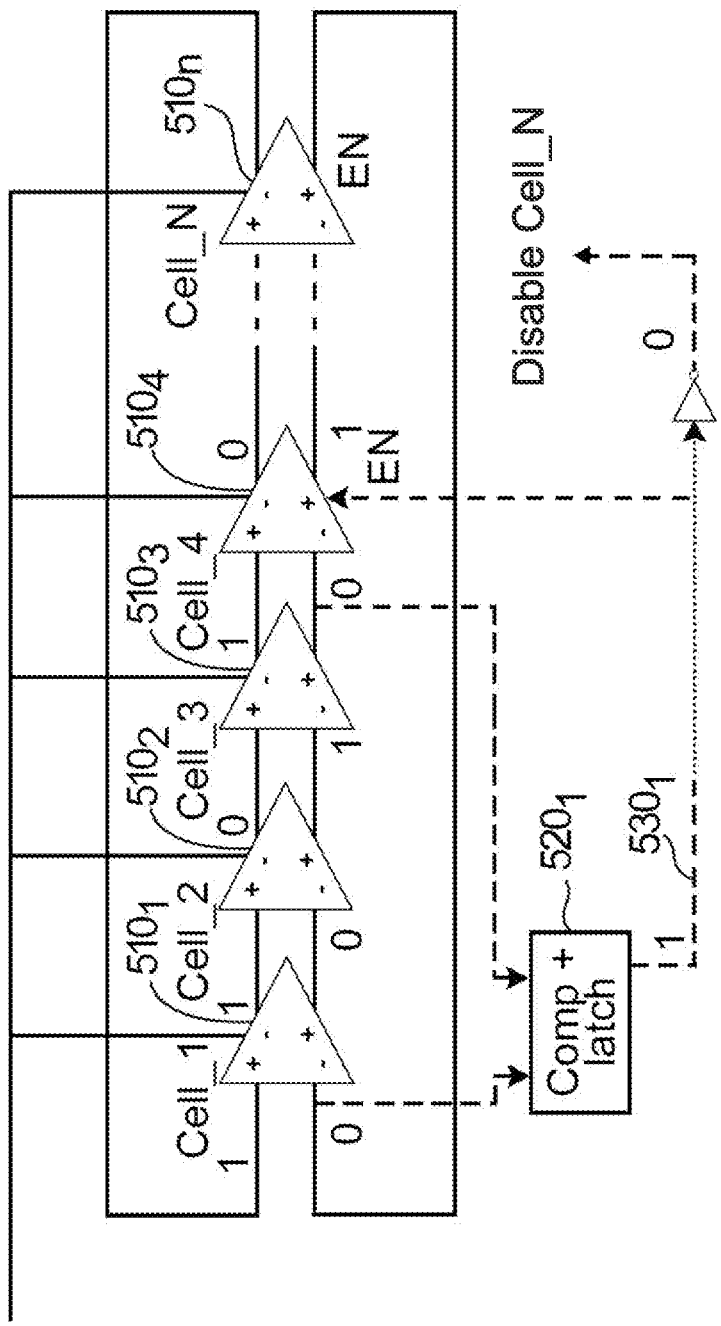
FIG. 9 illustrates enabling and disabling cells of a VCRO in a high frequency case in accordance with one example.

FIG. 9 illustrates enabling and disabling cells of a VCRO in a high frequency case in accordance with one example. The VCRO includes N cells $510_1$-$510_n$ (Cell_1, Cell_2, . . . , Cell_N), i.e. inverters and N transition detectors $520_1$-$520_n$. FIG. 9 illustrates only one transition detector $520_1$ for the first cell $510_1$ for simplicity but each cell $510_1$-$510_n$ is coupled to a transition detector (e.g. a comparator and a latch) for detecting a state transition of each cell $510_1$-$510_n$.

In this example, the state transition in the cell $510_1$ is detected by comparing an input of the cell $510_1$ with an output of the cell $510_3$. When the input of the cell $510_1$ and the output of the cell $510_3$ become the same (both are either '1s' or '0s') it means that a state transition is happening in the cell $510_1$ and a control signal $530_1$ may be sent to the cell $510_4$ to enable the cell $510_4$. The control signal $530_1$ may also be sent to another cell (e.g. Cell_N-3) to reset the latch in that cell, which disables Cell_N $510_n$.

Figure 10:
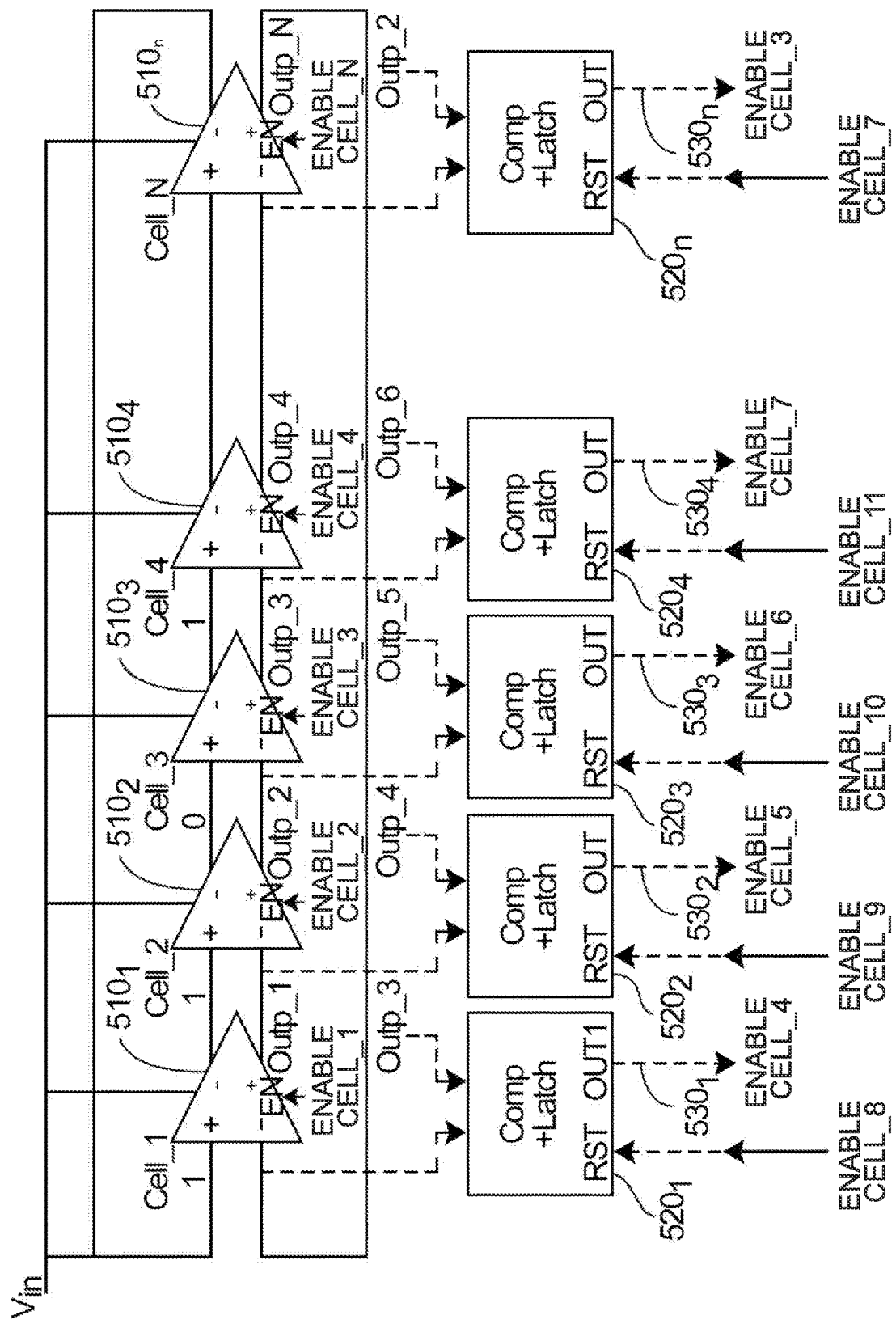
FIG. 10 shows an example structure of a VCRO and implementation of enabling and disabling the cells of the VCRO in the high frequency cases in accordance with one example.

FIG. 10 shows an example structure of a VCRO and implementation of enabling and disabling the cells of the VCRO in the high frequency cases in accordance with one example. The VCRO includes N cells $510_1$-$510_n$ (Cell_1, Cell_2, . . . , Cell_N), i.e. inverters and N transition detectors $520_1$-$520_n$. It should be noted that the number of cells (N) may be any number. Each cell $510_1$-$510_n$ is coupled to a corresponding transition detector $520_1$-$520_n$ for detecting a state transition of each cell $510_1$-$510_n$. Each transition detector $520_1$-$520_n$ may include a comparator and a latch. When a transition of a cell $510_1$-$510_n$ is detected, a transition detector $520_1$-$520_n$ coupled to the cell $510_1$-$510_n$ asserts a control signal $530_1$-$530_n$ to enable another cell in the ring, and this control signal is maintained by the latch until it is reset by another transition detector $520_1$-$520_n$.

As explained above, in the high frequency cases, the control signal may be generated not from the next cell but from one or few cells ahead of the next cell. For example, the transition detector $520_1$ detects a state transition of the cell $510_1$ by comparing the input to the cell $510_1$ and the output from the cell $510_3$ and asserts a control signal $530_1$ once a transition of the cell $510_1$ is detected. The control signal $530_1$ is latched by a latch in the transition detector $520_1$ and sent to the cell $510_4$ to enable the cell $510_4$. The control signal $530_1$ is also sent to reset the latch enabling another cell. For example, the control signal $530_1$ resets the latch in Cell_N-3 (not shown), which disables the cell $510_n$.

Similarly, the state transition of the cell $510_2$ is detected by comparing the input to the cell $510_2$ and the output of the cell $510_4$, and the control signal $530_2$ is sent to Cell_5 (not shown) to enable Cell_5 and to the latch in Cell_N-2 (not shown) to reset the latch in Cell_N-2, which disables the cell $510_1$. Similarly, the state transition of the cell $510_3$ is detected by comparing the input to the cell $510_3$ and the output of Cell_5 (not shown), and the control signal $530_3$ is sent to Cell_6 (not shown) to enable Cell_6 and to Cell_N-1 to reset the latch in Cell_N-1, which disables the cell $510_2$.

Figure 11:
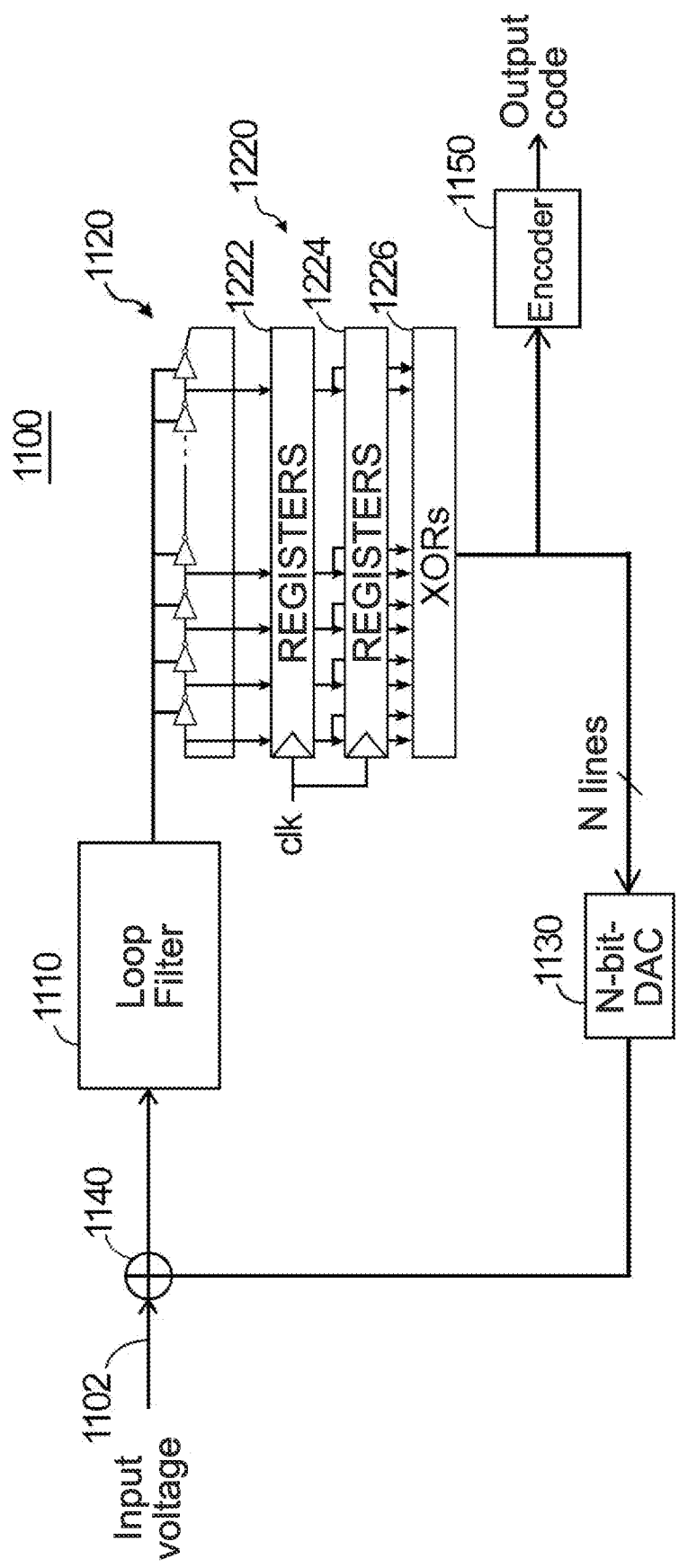
FIG. 11 shows an example sigma delta-based ADC including the VCO-based quantizer in accordance with one example.

FIG. 11 shows an example sigma delta-based ADC 1100 including the VCO-based quantizer in accordance with one example. The ADC 1100 includes a loop filter 1110, a quantizer 1120, and a DAC 1130. The input analog signal 1102 is filtered through the loop filter 1110. The quantizer 1120 converts the loop filter output to a digital signal. The quantizer 1120 may be an n-bit quantizer, where n is an integer. The ring oscillator-based quantizer with the capability of enabling and disabling ring oscillator cells disclosed herein may be used as the quantizer 1120. As an example, the quantizer 1120 may be a 4-bit quantizer. The quantizer 1120 may be implemented using 15 delay cells and 15 frequency detectors 1220 as shown in FIG. 2. The frequency detector 1220 calculates the phase change within a clock period. In order to compensate for the errors a feedback signal is sent back via the DAC 1130 to be subtracted from the input signal by an adder 1140 before entering the loop filter 1110. The DAC 1130 may be an n-bit DAC. The frequency detector 1220 may include two sets of registers 1222, 1224 and one set of exclusive OR gates 1226. The outputs of the inverters $1210_1$-$1210_n$ are sampled successively into two sets of registers 1222, 1224 by sampling clocks and two consecutive outputs of each inverter $1210_1$-$1210_n$ sampled into the registers 1222, 1224 are compared with the XOR gate 1226. The XOR gate outputs processed by the encoder 1150 to generate the output code. The encoder 1150 may be a thermometer-to-binary encoder which encodes the thermometer output code into a binary code.

Figure 12:
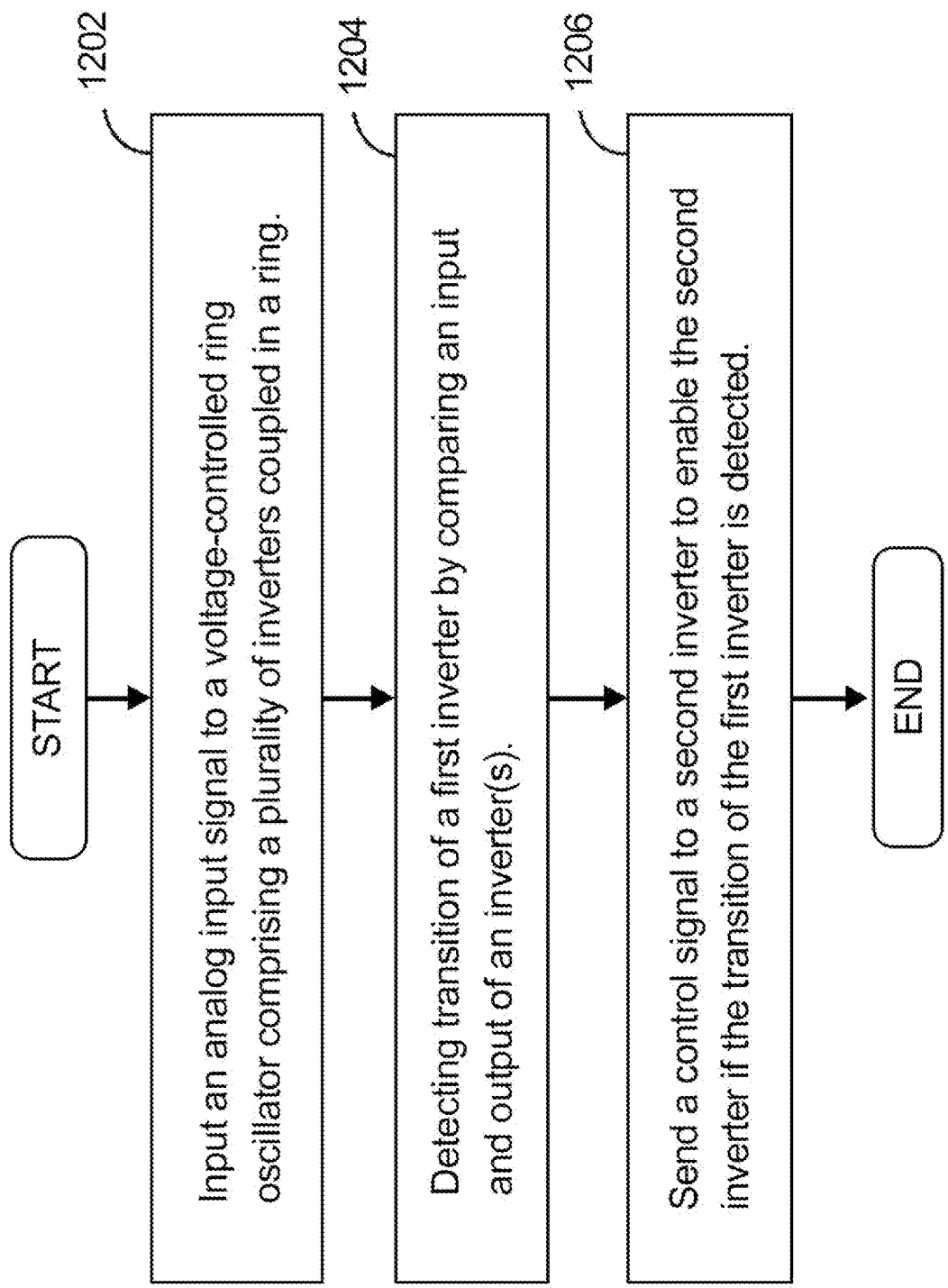
FIG. 12 is a flow diagram of an example process of converting an analog input signal to a digital signal in accordance with one example.

FIG. 12 is a flow diagram of an example process of converting an analog input signal to a digital signal in accordance with one example. An analog input signal in input to a voltage-controlled ring oscillator comprising a plurality of inverters coupled in a ring (1202). An output of one inverter is coupled to an input of a following inverter in the ring. A transition of a first inverter is detected by comparing an input and output of an inverter(s) (1204). A control signal is sent to a second inverter to enable the second inverter if the transition of the first inverter is detected (1206). In one example, an input and an output of the first inverter may be compared to detect the transition of the first inverter and a latch may be set to hold the control signal until it is reset. The control signal may also be sent to a third inverter to reset a latch in a transition detector coupled to the third inverter. In another example, an input of the first inverter and an output of a third inverter may be compared to detect the transition of the first inverter and a latch may be set to hold the control signal until it is reset. The control signal may be sent to a fourth inverter to reset a latch in a transition detector coupled to the fourth inverter.

Figure 13:
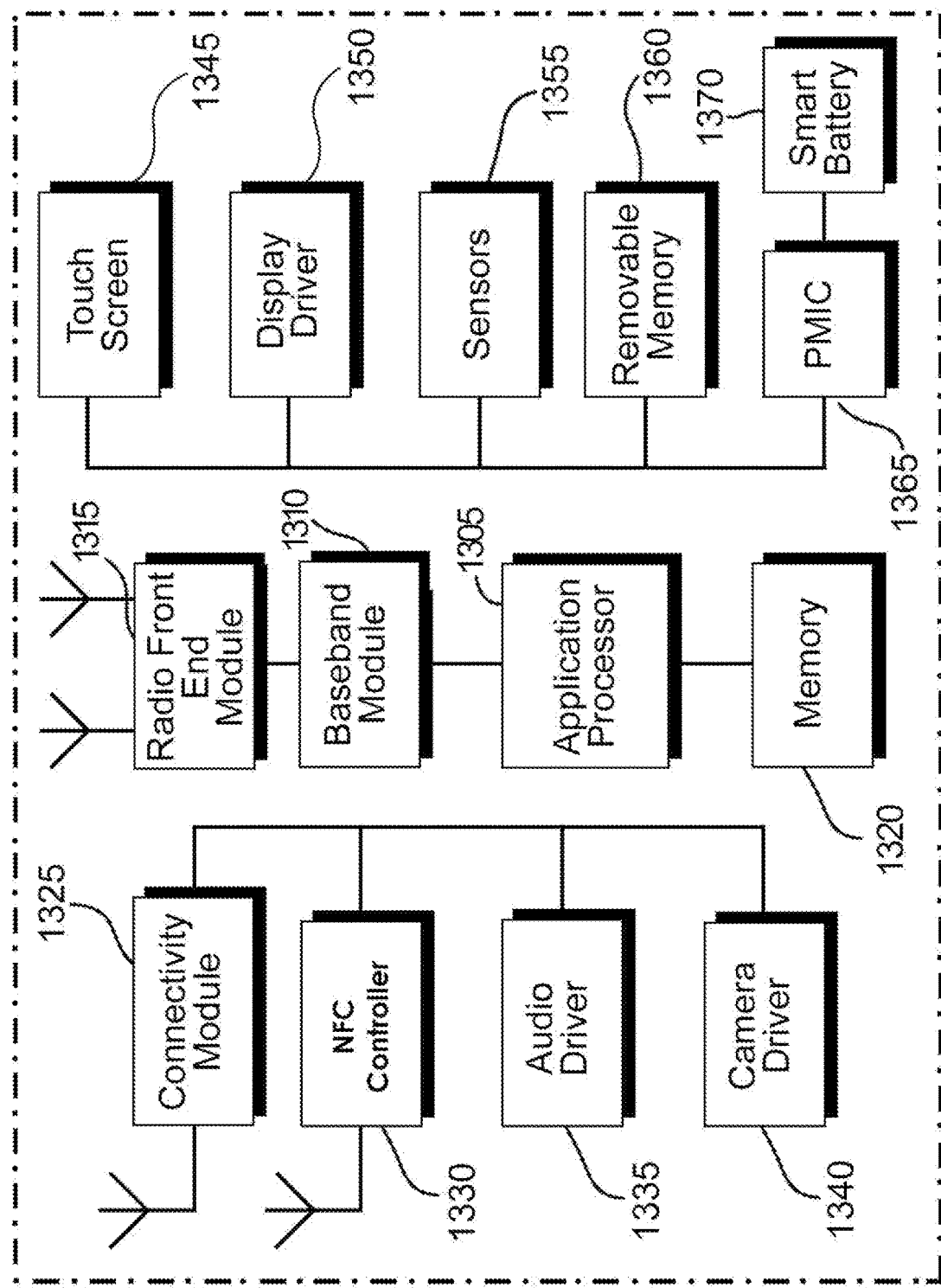
FIG. 13 illustrates a user device in which the examples disclosed herein may be implemented.

FIG. 13 illustrates a user device 1300 in which the examples disclosed herein may be implemented. The user device 1300 may be a mobile device in some aspects and includes an application processor 1305, baseband processor 1310 (also referred to as a baseband module), radio front end module (RFEM) 1315, memory 1320, connectivity module 1325, near field communication (NFC) controller 1330, audio driver 1335, camera driver 1340, touch screen 1345, display driver 1350, sensors 1355, removable memory 1360, power management integrated circuit (PMIC) 1365 and smart battery 1370.

In some aspects, application processor 1305 may include, for example, one or more CPU cores and one or more of cache memory, low drop-out voltage regulators (LDOs), interrupt controllers, serial interfaces such as serial peripheral interface (SPI), inter-integrated circuit (I²C) or universal programmable serial interface module, real time clock (RTC), timer-counters including interval and watchdog timers, general purpose input-output (JO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 1310 may be implemented, for example, as a solder-down substrate including one or more integrated circuits, a single packaged integrated circuit soldered to a main circuit board, and/or a multi-chip module containing two or more integrated circuits.

Figure 14:
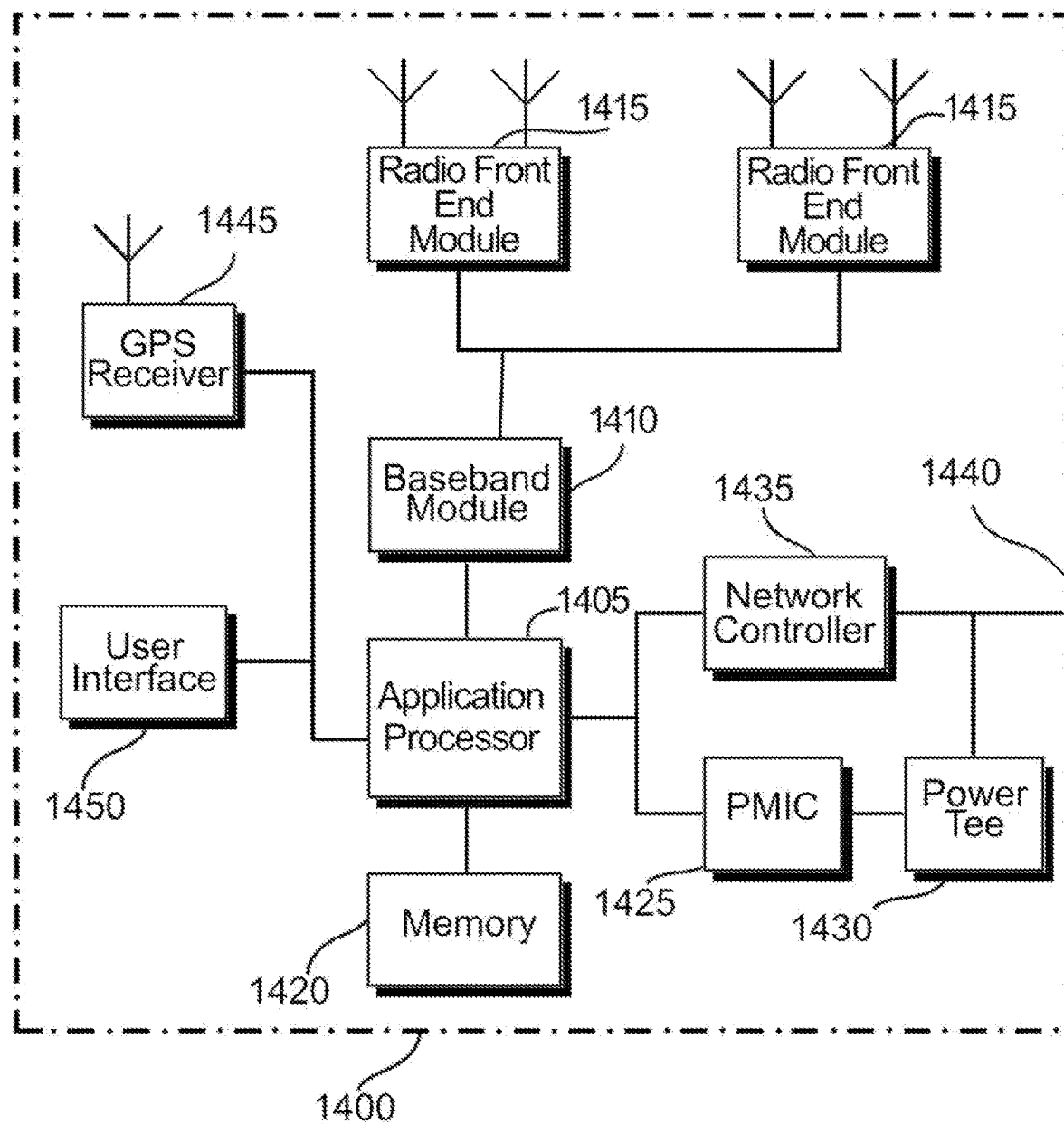
FIG. 14 illustrates a base station or infrastructure equipment radio head in which the examples disclosed herein may be implemented.

FIG. 14 illustrates a base station or infrastructure equipment radio head 1400 in which the examples disclosed herein may be implemented. The base station radio head 1400 may include one or more of application processor 1405, baseband modules 1410, one or more radio front end modules 1415, memory 1420, power management circuitry 1425, power tee circuitry 1430, network controller 1435, network interface connector 1440, satellite navigation receiver module 1445, and user interface 1450.

In some aspects, application processor 1405 may include one or more CPU cores and one or more of cache memory, low drop-out voltage regulators (LDOs), interrupt controllers, serial interfaces such as SPI, I$^2$C or universal programmable serial interface module, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 1410 may be implemented, for example, as a solder-down substrate including one or more integrated circuits, a single packaged integrated circuit soldered to a main circuit board or a multi-chip module containing two or more integrated circuits.

In some aspects, memory 1420 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magneto resistive random access memory (MRAM) and/or a three-dimensional crosspoint memory. Memory 1420 may be implemented as one or more of solder down packaged integrated circuits, socketed memory modules and plug-in memory cards.

In some aspects, power management integrated circuitry 1425 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 1430 may provide for electrical power drawn from a network cable to provide both power supply and data connectivity to the base station radio head 1400 using a single cable.

In some aspects, network controller 1435 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 1445 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 1445 may provide data to application processor 1405 which may include one or more of position data or time data. Application processor 1405 may use time data to synchronize operations with other radio base stations.

In some aspects, user interface 1450 may include one or more of physical or virtual buttons, such as a reset button, one or more indicators such as light emitting diodes (LEDs) and a display screen.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

The examples as described herein may be summarized as follows:

Example 1 is a voltage-controlled ring oscillator including a plurality of inverters coupled in a ring wherein an output of one inverter is coupled to an input of a following inverter in the ring and a transition detector configured to detect a transition of a first inverter and send a control signal to enable a second inverter if the transition of the first inverter is detected.

Example 2 is the voltage-controlled ring oscillator of example 1, wherein the transition detector includes a comparator configured to compare an input and an output of the first inverter to detect the transition of the first inverter and a latch configured to hold the control signal until it is reset.

Example 3 is the voltage-controlled ring oscillator of example 2, wherein the control signal is sent to a third inverter to reset the latch in a transition detector coupled to the third inverter.

Example 4 is the voltage-controlled ring oscillator of example 1, wherein the transition detector includes a comparator configured to compare an input of the first inverter and an output of a third inverter to detect the transition of the first inverter and a latch configured to hold the control signal until it is reset.

Example 5 is the voltage-controlled ring oscillator of example 4, wherein the control signal is sent to a fourth inverter to reset the latch in a transition detector coupled to the fourth inverter.

Example 6 is the voltage-controlled ring oscillator as in any one of examples 1-5, further including multiple sets of registers, wherein each set of registers is configured to store outputs of the inverters at consecutive clocks and a set of exclusive OR gates configured to compare data stored in the multiple set of registers.

Example 7 is a sigma delta analog-to-digital converter. The sigma delta analog-to-digital converter includes a loop filter configured to filter an analog input signal to attenuate quantization errors in a band of interest, a voltage-controlled ring oscillator configured to convert an output of the loop filter to an n-bit digital signal, and a digital-to-analog converter configured to generate a feedback signal to be subtracted from the analog input signal based on the n-bit digital signal. The voltage-controlled ring oscillator includes a plurality of inverters coupled in a ring wherein an output of one inverter is coupled to an input of a following inverter in the ring and a transition detector configured to detect a transition of a first inverter and send a control signal to enable a second inverter if the transition of the first inverter is detected.

Example 8 is the sigma delta analog-to-digital converter of example 7, wherein the transition detector includes a comparator configured to compare an input and an output of the first inverter to detect the transition of the first inverter and a latch configured to hold the control signal until it is reset.

Example 9 is the sigma delta analog-to-digital converter of example 8, wherein the control signal is sent to a third inverter to reset the latch in a transition detector coupled to the third inverter.

Example 10 is the sigma delta analog-to-digital converter of example 7, wherein the transition detector includes a comparator configured to compare an input of the first inverter and an output of a third inverter to detect the transition of the first inverter and a latch configured to hold the control signal until it is reset.

Example 11 is the sigma delta analog-to-digital converter of example 10, wherein the control signal is sent to a fourth inverter to reset the latch in a transition detector coupled to the fourth inverter.

Example 12 is a method for converting an analog input signal to a digital signal, including inputting an analog input signal to a voltage-controlled ring oscillator comprising a plurality of inverters coupled in a ring wherein an output of one inverter is coupled to an input of a following inverter in the ring, detecting a transition of a first inverter, and sending a control signal to enable a second inverter if the transition of the first inverter is detected.

Example 13 is the method of example 12, further including comparing an input and an output of the first inverter to detect the transition of the first inverter, setting a latch to hold the control signal until it is reset, and sending the control signal to a third inverter to reset a latch in a transition detector coupled to the third inverter.

Example 14 is the method of example 12, further including comparing an input of the first inverter and an output of a third inverter to detect the transition of the first inverter, setting a latch to hold the control signal until it is reset, and sending the control signal to a fourth inverter to reset a latch in a transition detector coupled to the fourth inverter.

Example 15 is a machine-readable storage including machine readable instructions, when executed, to implement a method or realize an apparatus as in any one of examples 1-14.

Example 16 is a machine-readable medium including code, when executed, to cause a machine to perform any of the methods in examples 1-14.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A voltage-controlled ring oscillator, comprising:
   a plurality of inverters coupled in a ring wherein an output of one inverter is coupled to an input of a following inverter in the ring; and
   a transition detector configured to detect a transition of a first inverter and send a control signal to enable a second inverter if the transition of the first inverter is detected.

2. The voltage-controlled ring oscillator of claim 1, wherein the transition detector comprises:
   a comparator configured to compare an input and an output of the first inverter to detect the transition of the first inverter; and
   a latch configured to hold the control signal until it is reset.

3. The voltage-controlled ring oscillator of claim 2, wherein the control signal is sent to a third inverter to reset the latch in a transition detector coupled to the third inverter.

4. The voltage-controlled ring oscillator of claim 1, wherein the transition detector comprises:
   a comparator configured to compare an input of the first inverter and an output of a third inverter to detect the transition of the first inverter; and
   a latch configured to hold the control signal until it is reset.

5. The voltage-controlled ring oscillator of claim 4, wherein the control signal is sent to a fourth inverter to reset the latch in a transition detector coupled to the fourth inverter.

6. The voltage-controlled ring oscillator of claim 1, further comprising:
   multiple sets of registers, wherein each set of registers is configured to store outputs of the inverters at consecutive clocks; and
   a set of exclusive OR gates configured to compare data stored in the multiple set of registers.

7. A sigma delta analog-to-digital converter, comprising:
   a loop filter configured to filter an analog input signal to attenuate quantization errors in a band of interest;
   a voltage-controlled ring oscillator configured to convert an output of the loop filter to an n-bit digital signal; and
   a digital-to-analog converter configured to generate a feedback signal to be subtracted from the analog input signal based on the n-bit digital signal,
   wherein the voltage-controlled ring oscillator comprises:
   a plurality of inverters coupled in a ring wherein an output of one inverter is coupled to an input of a following inverter in the ring; and
   a transition detector configured to detect a transition of a first inverter and send a control signal to enable a second inverter if the transition of the first inverter is detected.

8. The sigma delta analog-to-digital converter of claim 7, wherein the transition detector comprises:
   a comparator configured to compare an input and an output of the first inverter to detect the transition of the first inverter; and
   a latch configured to hold the control signal until it is reset.

9. The sigma delta analog-to-digital converter of claim 8, wherein the control signal is sent to a third inverter to reset the latch in a transition detector coupled to the third inverter.

10. The sigma delta analog-to-digital converter of claim 7, wherein the transition detector comprises:
    a comparator configured to compare an input of the first inverter and an output of a third inverter to detect the transition of the first inverter; and
    a latch configured to hold the control signal until it is reset.

11. The sigma delta analog-to-digital converter of claim 10, wherein the control signal is sent to a fourth inverter to reset the latch in a transition detector coupled to the fourth inverter.

12. A method for converting an analog input signal to a digital signal, comprising:
    inputting an analog input signal to a voltage-controlled ring oscillator comprising a plurality of inverters coupled in a ring wherein an output of one inverter is coupled to an input of a following inverter in the ring;
    detecting a transition of a first inverter; and
    sending a control signal to enable a second inverter if the transition of the first inverter is detected.

13. The method of claim 12, further comprising:
    comparing an input and an output of the first inverter to detect the transition of the first inverter;
    setting a latch to hold the control signal until it is reset; and
    sending the control signal to a third inverter to reset a latch in a transition detector coupled to the third inverter.

14. The method of claim 12, further comprising:
    comparing an input of the first inverter and an output of a third inverter to detect the transition of the first inverter;
    setting a latch to hold the control signal until it is reset; and
    sending the control signal to a fourth inverter to reset a latch in a transition detector coupled to the fourth inverter.

* * * * *